United States Patent [19]

Gasser et al.

[11] Patent Number: 5,388,030
[45] Date of Patent: Feb. 7, 1995

[54] METAL MODULE HOUSING HAVING A PLURALITY OF LUGS FORMED THEREIN FOR SUPPORTING AND GROUNDING A PRINTED CIRCUIT BOARD

[75] Inventors: Markus Gasser, Unterehrendingen; Markus Hänsli, Däniken; Robert Schilling, Niederrohrdorf; Stefan Schneeberger, Steffisburg, all of Switzerland

[73] Assignee: Asea Brown Boveri, Ltd., Baden, Switzerland

[21] Appl. No.: 959,982

[22] Filed: Oct. 13, 1992

[30] Foreign Application Priority Data

Oct. 11, 1991 [CH] Switzerland ............ 2998/91

[51] Int. Cl.$^6$ .................... H05K 9/00; H05K 7/14; H01R 23/68
[52] U.S. Cl. .................... 361/818; 174/35 R; 174/51; 361/730; 361/731; 361/736; 361/753; 361/785; 361/796; 361/799; 361/800
[58] Field of Search .............. 174/35 R, 35 GC, 51; 312/223.1, 223.2; 361/728, 729, 730, 731, 736, 733, 752, 753, 784, 785, 786, 788, 796, 797, 799, 800, 803, 816, 818, 724; 439/108, 109, 608, 609, 485

[56] References Cited

U.S. PATENT DOCUMENTS

| | | |
|---|---|---|
| 3,052,821 | 9/1962 | Scoville . |
| 3,794,954 | 2/1974 | Reimer ............... 439/62 |
| 4,628,413 | 12/1986 | Speraw ............... 361/797 |
| 4,821,145 | 4/1989 | Corfits et al. ........ 174/35 R |
| 4,926,291 | 5/1990 | Sarraf ................ 361/818 |
| 5,070,430 | 12/1991 | Meusel et al. ........ 361/753 |
| 5,166,864 | 11/1992 | Chitwood et al. ..... 174/35 R |
| 5,218,518 | 6/1993 | Deinhardt et al. .... 361/753 |
| 5,253,140 | 10/1993 | Inoue et al. ......... 361/728 |
| 5,323,296 | 6/1994 | Gasser et al. ........ 361/736 |

FOREIGN PATENT DOCUMENTS

| | | | |
|---|---|---|---|
| 0067757 | 12/1982 | European Pat. Off. . | |
| 0165434 | 12/1985 | European Pat. Off. . | |
| 0332909 | 9/1989 | European Pat. Off. ..... | 174/35 R |
| 0536560 | 4/1993 | European Pat. Off. ..... | 361/800 |
| 0228696 | 10/1985 | Germany ............ | 174/35 R |
| 3412593 | 10/1985 | Germany ............ | 361/724 |
| 8800430 | 3/1988 | Germany . | |
| 8628199 | 1/1990 | Germany . | |
| 01-81399 | 3/1989 | Japan .............. | 174/35 R |
| 2-130895 | 5/1990 | Japan .............. | 174/51 |
| 2-272797 | 11/1990 | Japan .............. | 361/818 |
| 2226706 | 7/1990 | United Kingdom .... | 174/51 |

OTHER PUBLICATIONS

IBM Technical Disclosure Bulletin "Method for Retaining/Grounding An Electronic Card Within Card Covers" vol. 32 No. 1 Jun. 1989.

Primary Examiner—Leo P. Picard
Assistant Examiner—Donald A. Sparks
Attorney, Agent, or Firm—Ostrolenk, Faber, Gerb & Soffen

[57] ABSTRACT

The input and/or output device for process data has a mounting rack (1), as well as a plurality of modules (2) fastened on the mounting rack (1). A process connector (4) can be inserted into each of the modules (2) on the front side in each case. Each module (2) has a circuit board (17) which is arranged in a housing (8), as well as a terminal strip (18) which is connected non-positively to the process connector (4). The terminal strip (18) serves to receive contact pins (26) which interact with contacts of the process connector (4). The input and/or output device is intended to demonstrate a high degree of operational reliability even in the case of a high level of mechanical and electromagnetic stresses. This is achieved in that the module housing (8) is predominantly formed from metal plate and has lugs (21, 22, 23) formed out of the metal plate which serve to carry the circuit board (17), some of which lugs are electroconductively connected to a conductor track (32) of the circuit board (17), and in that the module housing (8) is in contact with a metal part of the mounting rack (1) which is at ground potential.

10 Claims, 4 Drawing Sheets

METAL MODULE HOUSING HAVING A PLURALITY OF LUGS FORMED THEREIN FOR SUPPORTING AND GROUNDING A PRINTED CIRCUIT BOARD

This application is related to a co-pending application having Ser. No. 07/781,402, now U.S. Pat. No. 5,323,296.

BACKGROUND OF THE INVENTION

1. Field of the Invention

The invention relates to an input and/or output device for process data. The device includes a mounting rack and at least one module fastened on the mounting rack. A process connector can be inserted into the at least one module on the front side thereof. The at least one module has at least one circuit board which is located in a housing and is electroconductively connected to a process connector and to a bus connector, as well as a terminal strip. The at least one circuit board is connected non-positively to the process connector, for receiving contact pins which interact with contacts of the process connector.

Such input and/or output devices have modules which are fastened on a mounting rack and are connected via process connectors and cables to a device for executing a process. The modules communicate with one another via a system bus. Each of the modules include at least one circuit board located in a housing. The modules pick up signals from signal transmitters of a process execution device, process the signals, taking signals output by other modules into account if appropriate, and/or feed signals to signal receivers of the process execution device. Depending on requirements, a module may perform input, output, input and output and/or processing functions. The features of the device are essentially determined by the functions of the individual modules. The device, and hence in particular also each individual module, must not be damaged by the effects of electromagnetic interference, nor must its functioning be impaired. This is generally achieved by diverting usually high-frequency interference currents flowing toward the device to ground by means of protective devices before the interference currents enter circuits provided in one of the modules. The circuits are protected against the coupling-in of non-line-related interference by a shielding device.

2. Discussion of Background

An input and/or output device of the type mentioned above is known, for example, from EP-A-165 434. In this device, or in comparable devices, the housings of the modules are usually made of plastic. Unwanted interference currents introduced into a module via the process connector are conducted by conductor tracks arranged on the circuit board, or by a ground wire inserted into the housing of the module, from the signal input on the front side to a ground terminal of the module in contact with the mounting rack. It is customary for additional metal coatings or insertion plates to be provided on the housing. As a result of these measures, circuits provided on the circuit board are shielded from unwanted electromagnetic radiation, and consequently the full functioning of the circuits is maintained.

SUMMARY OF THE INVENTION

Accordingly, one object of the invention is to provide a novel input and/or output device of the type described above, which has a high operational reliability even in the case of a high level of mechanical and electromagnetic stresses.

The input and/or output device according to the invention is characterized by an extremely high electromagnetic compatibility. Interference currents flowing toward the device via the process connectors can be carried immediately from the process connector to the large-area and hence low-impedance ground reference of the housing of a module formed from a metal plate, and can then flow away directly to ground. Only a small voltage drop results from the low-impedance grounding line. The device according to the invention has therefore a considerably greater immunity to interference than a device with a grounding line of comparatively small dimensions. In this connection, it is accordingly also advantageous that, as a result of the low current density of a possibly occurring interference current, at the same time the strength of the associated magnetic interference field coupled into the circuits is also very low. A further advantage is conferred by the fact that radiation-linked interference is already shielded by the metallic housing of each module. Thus, contact-requiring insertion plates and metal-coated plastic housings are unnecessary.

BRIEF DESCRIPTION OF THE DRAWINGS

A more complete appreciation of the invention and many of the attendant advantages thereof will be readily apparent as the same becomes better understood by reference to the following detailed description when considered in connection with the accompanying drawings, wherein.

DESCRIPTION OF THE PREFERRED EMBODIMENTS

Figure 1:
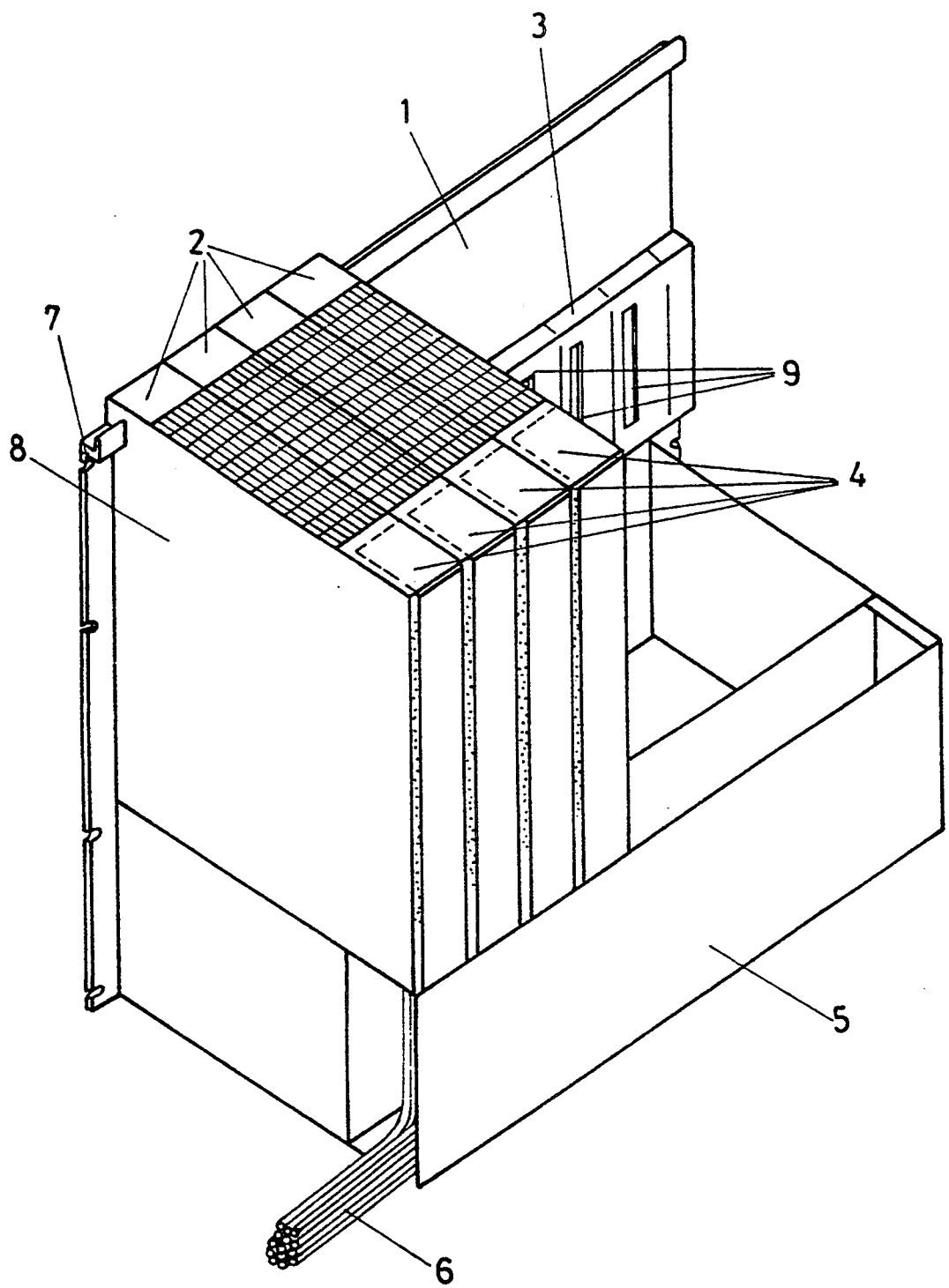
FIG. 1 shows a perspective view of a simplified representation of an embodiment of the input and/or output device according to the invention.

Referring now to the drawings, wherein like reference numerals designate identical or corresponding parts throughout the figures, the input and/or output device illustrated in FIG. 1 includes essentially box-shaped modules 2 mounted next to one another on a mounting rack 1, of which only identically designed modules are illustrated for reasons of simplicity. The mounting rack 1 includes a bus holder 3 and the modules 2 have process connectors located thereon. The process connectors 4 can be disconnected from the modules 2 and are connected via a cable 6 guided in a channel 5 to signal sources and signal receivers, not shown, of a device for executing a process, likewise not shown, such as a production or a machining process. A metal fastening element 7 and a bus connector which cannot be seen in FIG. 1 are located each case in the top part on the rear side of the modules 2. The fastening element 7 engages over a large area into the mounting rack 1 and also the housing 8 of the module 2. During mounting, each module 2 is inserted into the fastening element 7 and is pivoted with its rear side against the mounting rack 1 and is subsequently fully fixed by a screw, not shown. During pivoting, the bus connector and a bus coupling 9 provided on the bus holder 3 form a plug connection, via which signals are guided into the bus carried by the bus holder 3 and hence to other modules 2, and/or can be taken from the bus and hence from other modules 2. Mounting rack 1 and module 2 are made predominantly of metal and after the pivoting are electroconductively connected to one another directly and indirectly via the fastening element 7.

Figure 2:
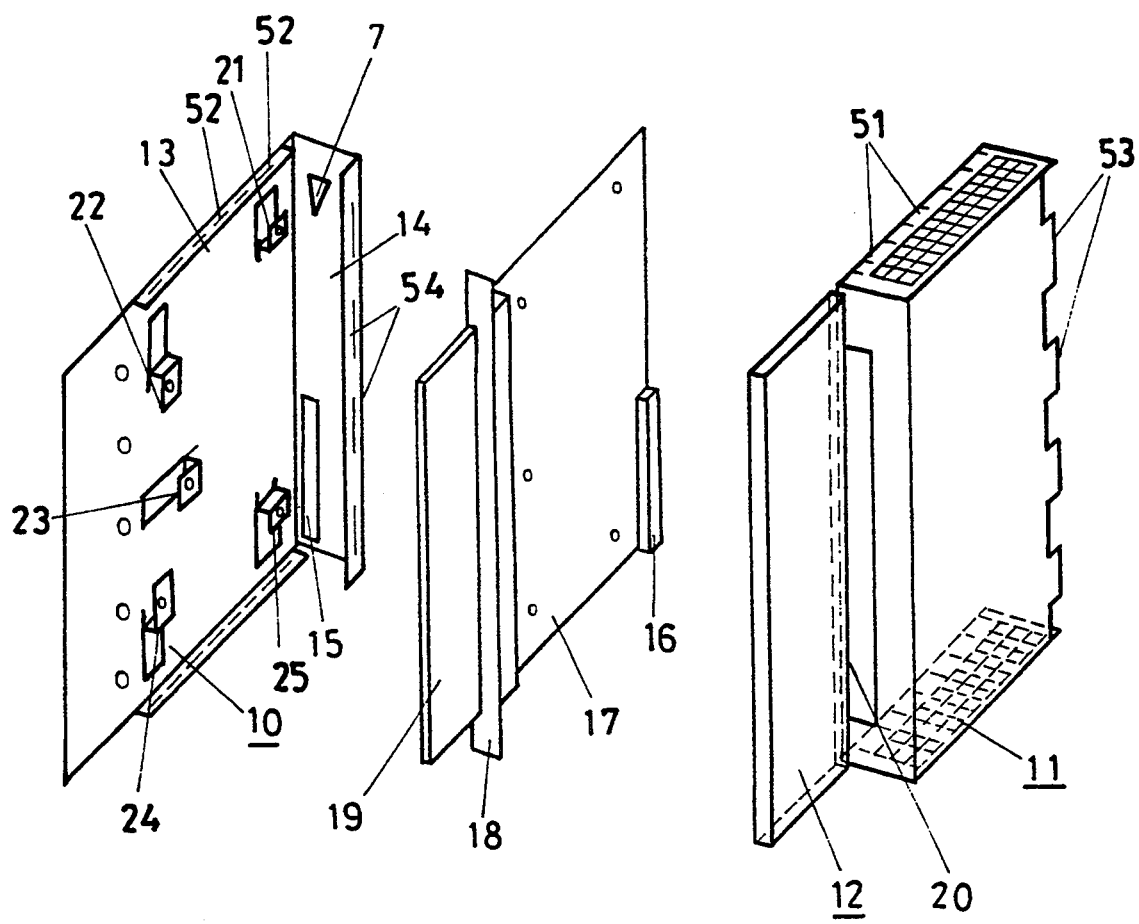
FIG. 2 shows a perspective view of the essential components of a module of the input and/or output device according to FIG. 1.

According to FIG. 2, each module contains a housing formed by a support part 10 and covers 11, 12. The support part 10 is essentially formed by two plates arranged in an L-shape perpendicular to one another, one of which is used as side wall 13 and the other of which is used as rear wall 14 of the module housing 8. A non-designated opening which receives the fastening element 7 is provided in the top part of the rear wall 14. Furthermore, the rear wall 14 has an opening 15 which serves for the passage of a bus connector 16. The bus connector 16 can be mounted on the support part 10 and has terminal pins, not shown, which are in contact with conductor tracks, likewise not shown, of a circuit board 17. The circuit board 17 is connected to a terminal strip 18 which can be supported on the support part 10 and has terminal pins, not shown, which interact with connection sockets of the process connector. The circuit board 17 is also connected to at least one circuit board 19 carrying indicating diodes, not shown. When the module 2 is assembled, the terminal strip 18 is fixed on the support part 10 and the circuit boards 17 and 19 connected thereto are enclosed in the module housing 8 formed in this way by snapping on the covers 11 and 12. An opening 20 provided in the cover 11 serves for the passage of the terminal strip 18.

The support part 10 and the cover 11 of the module housing 8 are formed from an electroconductive metal plate, in particular from a steel plate, whereas the cover 12 is formed from an insulating material. Lugs 21, 22, 23, 24 and 25 are formed into the metal plate of the support part 10 which serve to carry the circuit board 17 and form an opening through which electromagnetic radiation cannot penetrate. Some of these lugs, namely the lugs 22, 23 and 24, are electroconductively connected to a conductor track of the circuit board 17 after assembly of the module 2.

Figure 3:
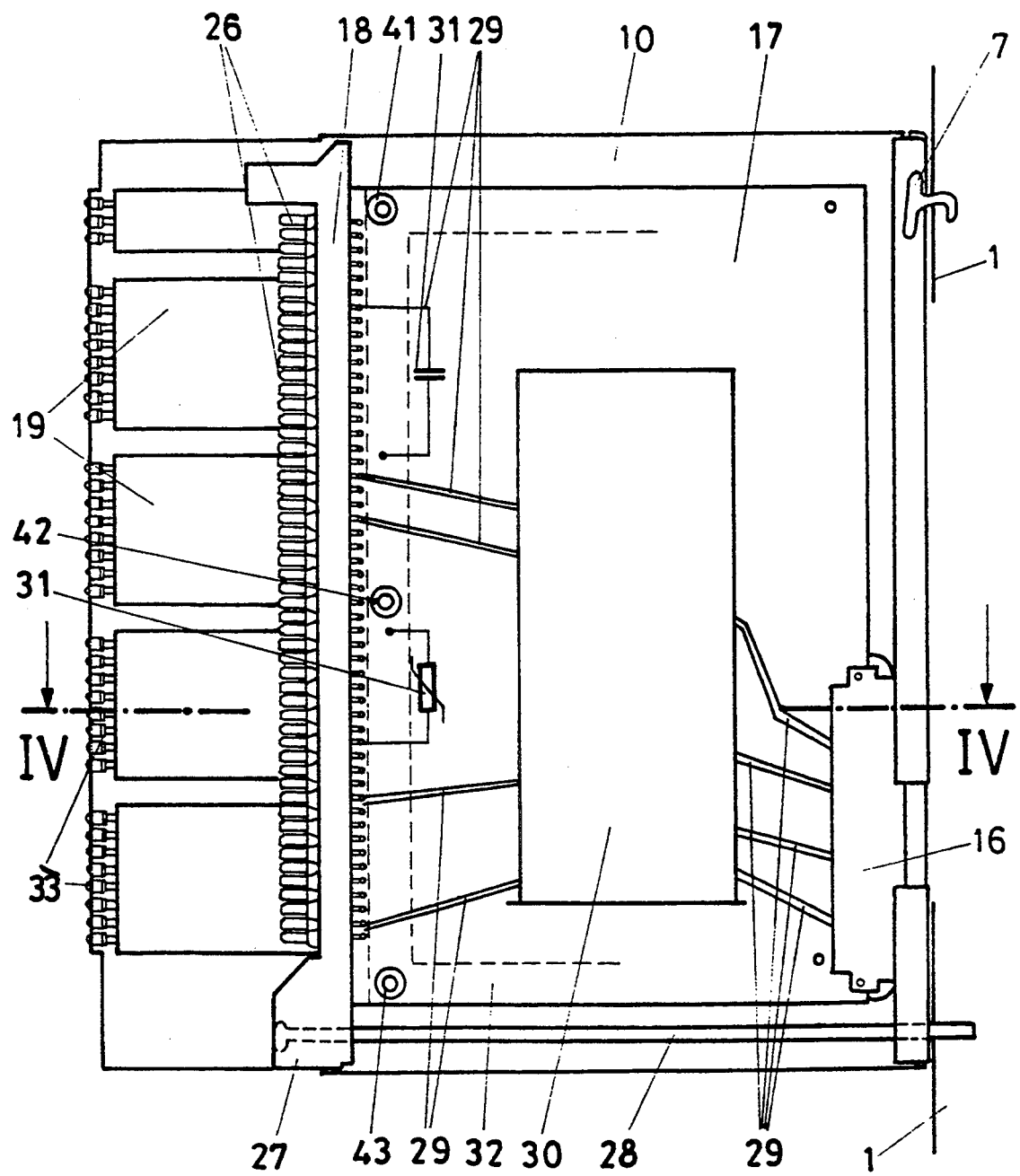
FIG. 3 shows a side view of a module of the input and/or output device according to FIG. 1 in which parts of the module housing have been removed.
Figure 4:
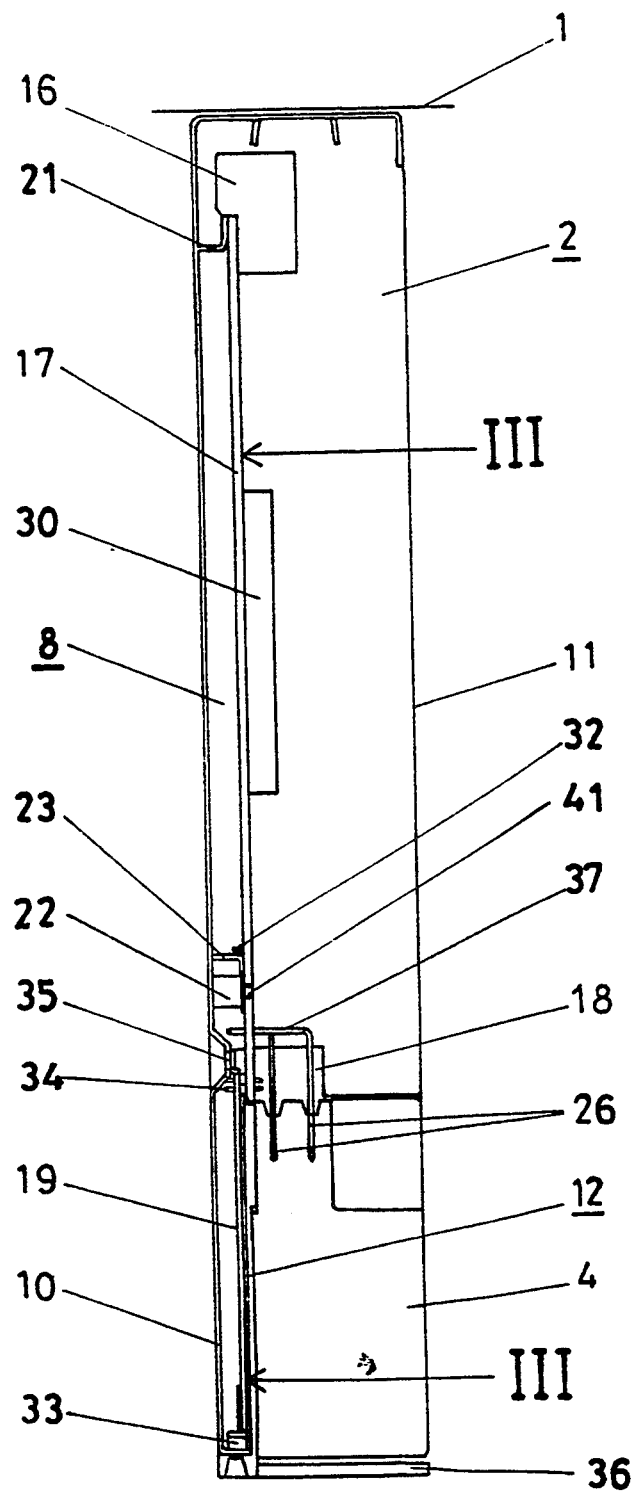
FIG. 4 shows a plan view of a section through a module according to FIG. 3 along the line IV—IV.

The more detailed design of a module 2 can be seen from FIGS. 3 and 4. Thus, it can be seen from FIG. 3 (side view after removal of the covers 11, 12) that the terminal strip 18 carries contact pins 26 and also a bearing element 27, which can also be provided on the support part 10 if necessary, and a clamping screw 28. On the side of the circuit board 17 facing the viewer, conductor tracks 29, circuits 30 and protective elements 31 are provided a conductor track 32 (shown with a dashed line) is situated, at least partly parallel to the terminal strip 18, on the side of the conductor track 17 remote from the viewer between the terminal strip and the circuits 30. A plurality of indicating diodes 33 are electroconductively connected to the contact pins 26 and are carried by circuit boards 19. In addition, hollow contacts 41, 42, 43 which have a large-area electrical contact with the conductor track 32 are let into the circuit board 17. The protective elements 31 are preferably designed as a capacitor, surge arrester or diode in each case, and are electroconductively connected to the conductor track 32 by a first current terminal and to one of the contact pins 26 in each case with a second current terminal.

It can be seen from FIG. 4 (plan view of a section through the module 2 along the line IV—IV, in which in contrast to FIG. 3 the covers 11 and 12 have been inserted and the process connector 4 has been pivoted into the module 2) that the circuit board 17 is connected electrically and mechanically to the circuit boards 19 via contact parts 34. The terminal strip 18 is secured to the support part 10 of the housing of the module 2 by screws 35. The circuit board 17 is fastened on the lugs 21–25 for instance, by screws which are guided in each case through an eye in the hollow contacts, e.g. 41, let into the circuit board 17 and provided in each lug, e.g. 22. The pivoted-in process connector 4 is covered by a door 36 which is pivotably attached to the cover 12 snapped into the support part 10. It can furthermore be seen that the contact pins 26 contain bent, elastically deformable connection parts 37, on which the circuit board 17 is supported, preferably by a press-in connection.

The input and/or output device according to the invention functions as follows: for starting operation, after the module 2 has been pivoted in and fixed by the fastening element 7 and the clamping screw 28 on the mounting rack 1, the process connector 4 is placed with a bearing element on the bearing element 27 of the terminal strip 18 and is guided by a rotational movement performed in the plane of the drawing according to FIG. 3 into the position illustrated in FIG. 4. Contacts, not shown, of the process connector 4 that are electroconductively connected to the cables 6 thereby make contact with the contact pins 26 and thus establish via the conductor tracks 29 and the circuits 30 an electrical linkage between the signal transmitters and/or signal receivers of the device for executing the process and the bus or other modules 2, respectively.

Since mechanical forces might also be transmitted via the cables 6, the pivoted-in process connector 4 is protected against unwanted movement by a screw connection, for example, which is covered by the door 36 and acts on the terminal strip 18. The mechanical forces stemming from the cables 6 are transmitted via the process connector 4, the terminal strip 18 and the support part 10 to the mounting rack 1. The circuit board 17 is therefore largely spared mechanical stresses during operation of the device.

The circuits 30 arranged on the circuit board 17 remain largely unaffected by electromagnetic interference. Predominantly high-frequency interference currents introduced via the process connector 4 are coupled out of the current path to the circuits 30 by the protective elements 31 arranged directly at the contact pins 26 and are conducted over a short path into the support part 10 of the grounded module housing 8 via the large-area conductor track 32 and the lugs 22, 23 and 24. The current path for the interference currents has an extremely low impedance since all current conductors have a short and large-area design. The interference current density flowing to ground is therefore low, and accordingly virtually no magnetic field caused by the interference currents is coupled into the circuits 30 even in the case of large interference currents. A particularly favorable guidance of the interference current is achieved if the lugs, such as the lugs 22 and 24 for instance, have a U-section, since the interference currents from the conductor track 32 are then guided preferably into the outer area of the support part 10 of the module housing, and the inner area of the module housing facing the circuit board 17 remains free of current and hence performs an additional shielding function. In general, however, a design of the lugs, such as the lug 23 for instance, with a Z-section is adequate to ensure a sufficiently good guidance of the interference currents. Moreover, the housing made of a metal plate shields the radiation-linked interference particularly effectively. Additional metal insertion plates and/or metal coatings of the module housing are therefore unnecessary.

As can be seen from FIG. 3, for example, the support part 10 of the module housing 8 is drawn forward so far into the side accessible to a user of the input and/or output device that the conductive part lying closest to the touchable surface is not a current terminal of an operating and/or display element accessible from the operator side of the device, such as the indicating diode 33 for instance, but is always a part of the housing. As a consequence, with a large degree of certainty, interference currents caused by electrostatic discharges flow directly to ground via the module housing 8 and not through the circuits 30. Suppressor circuits for the operating and display elements are therefore unnecessary. High-frequency interference currents caused by electrostatic discharges flow via the cover 12, made of insulating material, of the module housing 8 into the outer areas of the support part 10 and of the cover 11 over a large area, and hence to ground with low impedance. Due to the skin effect, the high-frequency current flows here only on the outer surface of the module housing 8. Current does not flow through the inner side and hence the latter acts as a shield for electrical and magnetic fields caused by the current flowing on the outer side.

When constructing the module housing 8, it is advisable to design the support part 10 and cover 11 in such a way that they interlock with one another over a large area once the device has been assembled. This is advantageously achieved in accordance with FIG. 2 in that springy detent noses 51 and depressions 52 which fix the detent noses when interlocked are arranged at the edge of mutually opposite and parallel extending moldings of the support part 10 and of the cover 11. In addition, in each case a bearing element 53 and 54, respectively is formed into the support part 10 and into the cover 11, respectively. The bearing element forms a swivel joint which can be pivoted until the cover 11 and the support part 10 interlock.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An input and/or output device for process data comprising:
   a) a mounting rack having a grounded portion;
   b) a bus holder located on said mounting rack;
   c) a plurality of substantially box-shaped modules positioned next to one another on said mounting rack so that a rear side of each of the modules contacts the mounting rack, each of said plurality of modules including:
      1) a process connector inserted in a front side of the module and having a plurality of contacts;
      2) a terminal strip having a plurality of contact pins which interact with the plurality of contacts of the process connector;
      3) a circuit board having circuits electroconductively connected to the contact pins and to a bus connector;
      4) a module housing formed predominately from a metal plate and supporting the circuit board, the terminal strip and the bus connector, the module housing being in electrical contact with the grounded portion of the mounting rack;
      5) a first opening which is arranged on a front side of the module housing and which serves as a passage for the terminal strip;
      6) a second opening which is arranged on a rear side of the module housing and which serves as a passage for the bus connector;
      7) a fastening element which detachably fastens the module housing to the grounded part of the mounting rack;
      8) a plurality of lugs formed out of the metal plate of the module housing and supporting the circuit board;
      9) a conductor track arranged on the circuit board parallel to the terminal strip and located between the terminal strip and the circuits, the conductor being connected electroconductively to at least one of the plurality of lugs; and
      10) at least one protective element provided on the circuit board and electroconductively connected to the conductor track by a first current terminal and to one of the contact pins by a second current terminal.

2. An input and/or output device as claimed in claim 12, wherein the module housing includes a support part which is drawn forward so far into an operator side of the input and/or output device that is accessible to a user that a conductive part located closest to a touchable surface of the module housing is not a current terminal of an operating and/or display element accessible from the operator side of the device but forms a part of said housing.

3. An input and/or output device as claimed in claim 2, wherein the module housing further comprises a cover interlocked with the support part.

4. An input and/or output device as claimed in claim 3, further comprising a plurality of resilient detent noses located on said cover and a plurality of depressions located in said support part, wherein the detent noses fit within the depressions to fix the support part to the cover.

5. An input and/or output device as claimed in claim 4, wherein a bearing element is formed between the support part and the cover, and wherein said bearing element comprises a swivel joint which is pivotable until the cover and the support part interlock.

6. An input and/or output device as claimed in claim 1, wherein the module housing further comprises a cover made predominately of an insulating material and an operating and display element is located under the cover.

7. An input and/or output device as claimed in claim 1, wherein at least one of the lugs is formed out of the metal plate.

8. An input and/or output device as claimed in claim 1, wherein at least one of the lugs is formed to have a U-shaped section.

9. An input and/or output device as claimed in claim 1, wherein the conductor track is arranged parallel to the terminal strip and located between the terminal strip and the circuits on the circuit board.

10. An input and/or output device as claimed in claim 9, wherein at least one protective element is provided on the circuit board and is electroconductively connected to the conductor track by a first current terminal and to one of the contact pins by a second current terminal.

* * * * *